United States Patent [19]

Gay

[11] Patent Number: 4,795,987
[45] Date of Patent: Jan. 3, 1989

[54] PARASITIC INSENSITIVE SWITCHED CAPACITOR FILTER

[75] Inventor: Michael J. Gay, Coppet, Switzerland

[73] Assignee: Motorola, Inc., Schaumburg, Ill.

[21] Appl. No.: 69,921

[22] Filed: Jul. 6, 1987

[30] Foreign Application Priority Data

Sep. 10, 1986 [GB] United Kingdom ............... 8621729

[51] Int. Cl.$^4$ ................................................ H03F 1/36
[52] U.S. Cl. ....................................... 330/107; 330/149
[58] Field of Search .................... 330/9, 85, 107, 149, 330/151

[56] References Cited

U.S. PATENT DOCUMENTS 4,716,388 12/1987 Jacobs ............................... 330/109

Primary Examiner—Gene Wan
Attorney, Agent, or Firm—John A. Fisher; Robert L. King

[57] ABSTRACT

A switched capacitor filter includes an amplifier in a feedback or feed-forward path thereof. The amplifier (A5, C6, S7,) has a gain dependent on the ratio of stray capacitances to the capacitors used in the filter so as to compensate for errors in filter characteristics which said stray capacitances would otherwise introduce.

7 Claims, 1 Drawing Sheet

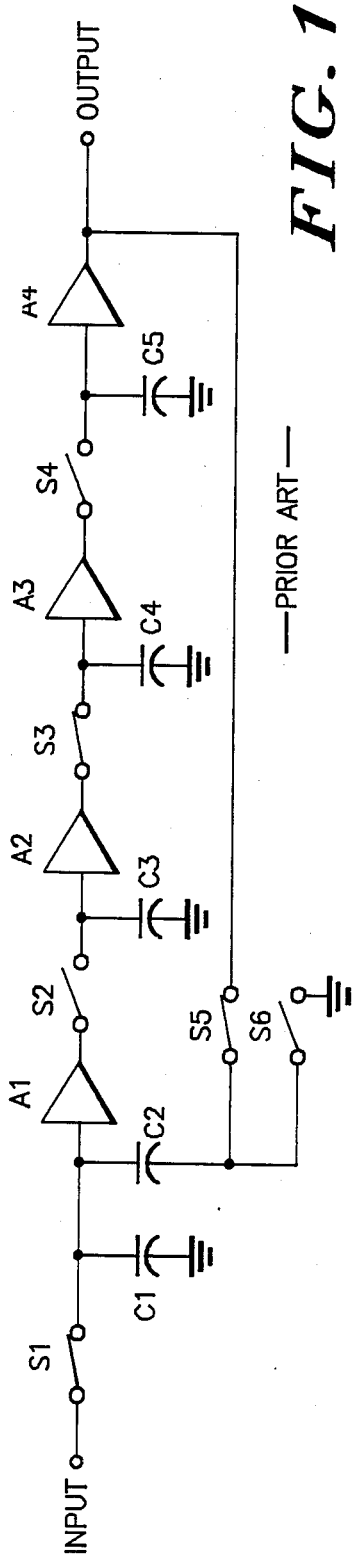
FIG. 1 —PRIOR ART—
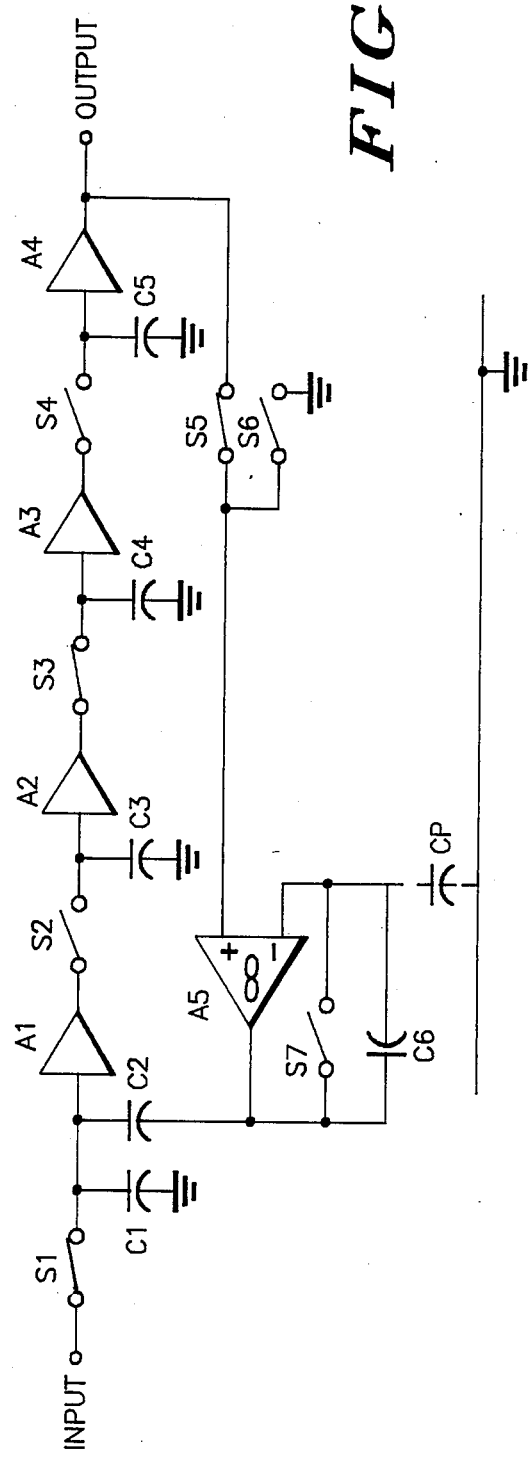
FIG. 2

PARASITIC INSENSITIVE SWITCHED CAPACITOR FILTER

BACKGROUND OF THE INVENTION

This invention relates to switched capacitor filters and more particularly to high frequency switched capacitor filters of the type comprising shift register structures combined with feedback and feed-forward arrangements.

As is well known the bandpass function of such filters is dependent on the input capacitances of the filter and is therefore sensitive to stray capacitances at the input side of the filter.

It is desirable that the effects of these stray capacitances be compensated in order that the capacitor values may be minimized while retaining adequate precision of the filter characteristics.

SUMMARY OF THE INVENTION

It is thus an object of the present invention to provide switched capacitor filters with circuitry for achieving such compensation.

Accordingly, there is provided a switched capacitor filter including an amplifier provided in a feedback or feed-forward path thereof, said amplifier having a gain dependent on the ratio of stray capacitances to the capacitors used in the filter so as to compensate for errors in filter characteristics which said stray capacitances would otherwise introduce.

In a preferred embodiment of the invention the switched capacitor filter comprises at least one filter amplifier and at least one filter switch coupled together via a filter node which is sensitive to stray capacitances, and in which the amplifier means comprises an operational amplifier having a stray capacitance at its inverting input matching the capacitance of said filter amplifier, a switch responsive to a clock signal and substantially identical to said filter switch and connected substantially similarly thereto, and a capacitor matching the total capacitance coupled to said filter node, wherein said switch and said capacitor are coupled between the inverting input and the output of said operational amplifier so that when said switch is open said operational amplifier provides an amplification of incremental input signal changes determined by said capacitor and by the total stray capacitance at the inverting input, said total stray capacitance being substantially equal to the total stray capacitance at said filter node when said filter switch connected thereto is open.

The amplifier may, of course, be coupled to a plurality of feedback or feed-forward paths in the filter. Furthermore, a plurality of amplifiers may be provided, if desired.

BRIEF DESCRIPTION OF THE DRAWINGS

One embodiment of the invention will now be more fully described by way of example with reference to the drawings of which:

FIG. 1 shows diagrammatically a switched capacitor filter of a well-known type; and FIG. 2 shows the filter of FIG. 1 with compensation for stray capacitance according to the invention.

DESCRIPTION OF THE INVENTION

High frequency switched capacitor filters can be realized using shift register structures combined with feedback and feed-forward arrangements. FIG. 1 shows a simple example of such a filter having a first set of switches ($S_1$, $S_3$, $S_5$) shown closed, responsive to a first clock signal, a second set of switches ($S_2$, $S_4$, $S_6$), shown open, responsive to a second clock signal, a set of unity gain buffer amplifiers ($A_1$, $A_2$, $A_3$, $A_4$) and a set of appropriately coupled capacitors ($C_1$, $C_2$, $C_3$, $C_4$, $C_5$). It will be appreciated that each set of switches must open before the other set closes.

It can be readily shown that the structure of FIG. 1 generates the bandpass function, in the Z domain:

$$H(Z) = \frac{1}{Z^2 + C_2/(C_1 + C_2)}.$$

It will be seen from this expression that the pole positions are dependent on the ratio of the capacitors $C_1$, $C_2$. Capacitor $C_1$ is, however, shunted by the input capacitance of the amplifier $A_1$ and by any capacitance to ground from the terminal of the switch $S_1$, connected thereto.

Referring to FIG. 1 it will be seen that if $C_1$, for example, is shunted by a stray capacitance $C_p$ then the ratio $$\frac{C_2}{C_1 + C_2}$$

becomes $$\frac{C_2}{C_1 + C_2 + C_p}.$$

Referring now also to FIG. 2, the present invention is based on the realisation that the coefficient may be restored to the ideal value if an amplifier having a gain given by the expression $$\frac{C_1 + C_2 + C_p}{C_1 + C_2}$$

Is inserted in the feedback path from the buffer amplifier $A_4$ to the switch $S_5$. It will be noted, furthermore, that said amplifier need provide this gain solely when the switch $S_5$ is closed. It is therefore possible to use an amplifier having a gain defined by a switched capacitor network comprising a capacitor of value equal to $C_1 + C_2$ and a stray capacitance matching $C_p$. The amplifier gain may thus be made to adapt automatically to variations in the ratio of the capacitors and stray capacitance.

FIG. 2 shows the filter of FIG. 1 with a suitable compensation amplifier structure provided. The input signal is applied to the non-inverting input of an operational amplifier $A_5$. The output of the amplifier is coupled via a switch $S_7$ responsive to a clock signal, in parallel with a capacitor $C_6$ to the inverting input. For convenience a ground reference line is included. The stray capacitance to ground from the inverting input of the amplifier and the terminal of the switch $S_7$ connected thereto is represented in FIG. 2 by the capacitor $C_p$.

The operation of the compensation amplifier structure in isolation from the rest of the filter will now be considered. During a first phase of the clock signal controlling the switch $S_7$, said switch is closed. The input signal is arranged to be at a reference level during this phase. The capacitor $C_6$ is discharged and the stray capacitance $C_p$ between the inverting input of the amplifier and ground is charged to said reference level. The output voltage is at the reference level.

During a second phase of said clock signal the switch $S_7$ is open. During this phase the input signal takes up its active level. By the feedback action the stray capacitance $C_p$ at the inverting input will be charged from the reference level to the action level. The charge required will be transferred via the capacitor $C_6$ across which a voltage will consequently be developed. The amplifier output signal excursion from the reference level will thus be greater than the input level excursion therefrom by the ratio:

$$\frac{C_6 + C_p}{C_6}$$

The switch $S_7$ can be made identical to those used in the filter and the amplifier $A_5$ can be readily designed to have substantially the same input capacitance as the filter amplifiers $A_1$–$A_4$. The stray capacitance can thus be matched to that occurring at the input node of one of said amplifiers. By making capacitor $C_6$ equal to the total of the capacitors connected to such a node there is obtained an amplifier having the gain necessary to compensate for the effects of stray capacitance.

Thus, during the state preceeding that shown in FIG. 2, the switches $S_6$, $S_7$ were closed while switch $S_5$ was open. The non-inverting input to amplifier $A_5$ was thus coupled to a reference level and by the feedback action the inverting input and output were constrained to adopt the same level. The capacitor $C_2$ was thus coupled between the input of amplifier $A_1$ and a voltage source at the reference level. It will be seen that the conditions were the same as those obtaining in FIG. 1 during the same state.

In the state shown, suppose that the output voltage of amplifier $A_4$ differs from the reference level by a voltage $V_4$. The output of amplifier $A_5$ will then be shifted from the reference level by an amount $$\frac{V_4 (C_6 + C_p)}{C_6}$$

The charge stored on capacitor $C_2$ in response to the signal $V_4$ will thus be $$\frac{V_4 C_2 (C_6 + C_p)}{C_6}$$

In the state succeeding that shown in FIG. 2, the switch $S_1$ will be open while the output of amplifier $A_5$ will be again at the reference level. By charge conservation it can readily be shown that the voltage then established at the input to amplifier $A_1$ in response to the difference voltage $V_4$ is given by:

$$(V_1)_4 = \frac{V_4 C_2 (C_6 + C_p)}{C_6} \times \frac{1}{C_1 + C_2 + C_{p1}}$$

where $C_{p1}$ is the capacitance to ground from the input terminal of amplifier $A_1$ and the terminal of switch $S_1$ connected thereto.

As explained, the switches $S_1$, $S_7$ may be made identical and the stray capacitances of $A_1$, $A_5$ may readily be matched. The total stray capacitances $C_{p1}$, $C_p$ may thus be made sensibly equal. Making $$C_6 = C_1 + C_2$$

there is obtained $$(V_1)_4 = \frac{V_4 C_2}{C_1 + C_2}$$

The feedback ratio from the output to the input is thus established at the desired value independently of the stray capacitance present at the input.

It will be evident that, if so desired, the stray capacitance $C_p$ and capacitor $C_6$ could be scaled with respect to $C_{p1}$ and $C_1$, $C_2$.

It will be appreciated that the described filter only serves to illustrate the technique underlying the invention. In a practical case the compensation amplifier may, if desired, be coupled to a plurality of feedback or feed-forward paths. More than one compensation amplifier may also be used.

I claim:

1. A switched capacitor filter including feedback means provided in a feedback path thereof, said switched capacitor filter having a plurality of series connected single input amplifiers incluing at least a first amplifier and a final amplifier, said feedback path coupled between an output of the final amplifier and an input of the first amplifier, said input of the first amplifier having both a first capacitor and a parasitic capacitance coupled between the input and a reference voltage terminal which provides an error in filter characteristics of the filter, and having a feedback capacitor coupled between the input and the feedback means, said feedback means further comprising:

an amplifier coupled between the output of the final amplifier and the input of the first amplifier, said amplifier having a compensating gain to cancel error resulting from the parasitic capacitance coupled to the input of the first amplifier.

2. The switched capacitor filter according to claim 1 further comprising:

a filter switch coupled to the input of the first amplifier for selectively coupling an input signal to the filter;

an operational amplifier having a stray capacitance at an inverting input thereof matching the parasitic capacitance of said filter amplifier;

a feedback switch coupled between the noninverting input of the operational amplifier and the input of the first amplifier, said feedback switch being responsive to a clock signal and substantially identical to said filter switch; and a feedback capacitor coupled between the inverting input of the operational amplifier and the input of the first amplifier, said feedback capacitance having a capacitive value matching a total capacitance coupled to said input of the first amplifier, so that when said feedback switch is open said operational amplifier provides an amplification of incremental input signal changes determined by said feedback capacitor and by the total stray capacitance at the inverting inplut, said total stray capacitance being substantially equal to the parasitic capacitance at said input of the first amplifier when said filter switch connected thereto is open.

3. The switched capacitor filter according to claim 1 wherein each of the series connected single input amplifiers is a unity gain buffer amplifier.

4. A switched capacitor filter comprising:
  a first switch having a first terminal for receiving an input signal and a second terminal;
  an input capacitor having a first electrode coupled to the second terminal of the first switch and a second electrode coupled to a reference voltage terminal;
  a first buffer amplifier having an input coupled to the first electrode of the input capacitor, said input having a parasitic capacitance coupled thereto, and having an output;
  at least one more buffer amplifier coupled in series with the first buffer amplifier including an output buffer amplifier having an output for providing an output signal;
  a second switch having a first terminal coupled to the output signal, and having a second terminal;
  a third switch having a first terminal coupled to the second terminal of the second switch, and having a second terminal; and
  amplifier means coupled between the second terminals of the second and third switches and the input of the first buffer amplifier, said amplifier means having a compensating gain to cancel error resulting from the parasitic capacitance coupled to the input of the first buffer amplifier.

5. The switched capacitor filter of claim 4 wherein said amplifier means further comprise:
  an operational amplifier having a noninverting input coupled to the second terminals of the second and third switches, an inverting input, and an output;
  a feedback capacitor having a first electrode coupled to the inverting input of the operational amplifier, and a second electrode coupled to the output of the operational amplifier;
  a fourth switch having a first terminal coupled to the inverting input of the operational amplifier and a second terminal coupled to the output of the operational amplifier; and
  a coupling capacitor having a first electrode coupled to the output of the operational amplifier and a second electrode coupled to the input of the input of the first buffer amplifier.

6. A switched capacitor filter comprising at least one filter amplifier having at least one filter capacitor and at lesat one filter switch coupled together via a filter node which is sensitive to stray capacitances, the filter node being coupled to the input of at least one buffer amplifier, the switched capacitor filter also including at least one compensation amplifier means provided in a feedback path between the output of said buffer amplifier and an input of said filter, said compensation amplifier means having a gain dependent on the ratio of stray capacitances to the filter capacitor so as to compensate for error in filter characteristics which said stray capacitances would otherwise introduce.

7. A switched capacitor filter according to claim 6 wherein the compensation amplifier means comprises an operational amplifier having a stray capacitance at its inverting input matching the capacitance of said filter amplifier, a switch responsive to a clock signal and substantially identical to said filter switch and connected substantially similarly thereto, and a capacitor matching the total capacitance coupled to said filter node, wherein said switch and said capacitor are coupled between the inverting input and the output of said operational amplifier so that when said switch is open said operational amplifier provides an amplification of incremental input signal changes determined by said capacitor and by the total stray capacitance at the inverting input, said total stray capacitance being substantially equal to the total stray capacitance at said filter node when said filter switch connected thereto is open.

* * * * *